United States Patent
Khan et al.

(10) Patent No.: US 10,685,705 B2
(45) Date of Patent: Jun. 16, 2020

(54) PROGRAM AND ERASE MEMORY STRUCTURES

(71) Applicant: GLOBALFOUNDRIES INC., Grand Cayman (KY)

(72) Inventors: Faraz Khan, Los Angeles, CA (US); Norman W. Robson, Hopewell Junction, NY (US); Toshiaki Kirihata, Poughkeepsie, NY (US); Danny Moy, Bethel, CT (US); Darren L. Anand, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/047,529

(22) Filed: Jul. 27, 2018

(65) Prior Publication Data

US 2020/0035295 A1 Jan. 30, 2020

(51) Int. Cl.
| | |
|---|---|
| *G11C 16/04* | (2006.01) |
| *G11C 11/56* | (2006.01) |
| *H01L 29/792* | (2006.01) |
| *H01L 27/11573* | (2017.01) |
| *H01L 29/73* | (2006.01) |
| *G11C 16/10* | (2006.01) |
| *G11C 16/14* | (2006.01) |

(52) U.S. Cl.
CPC ...... *G11C 11/5671* (2013.01); *G11C 16/0466* (2013.01); *G11C 16/10* (2013.01); *G11C 16/14* (2013.01); *H01L 27/11573* (2013.01); *H01L 29/73* (2013.01); *H01L 29/7923* (2013.01)

(58) Field of Classification Search
CPC ..... G11C 11/5671; G11C 16/14; G11C 16/10; G11C 16/0466; H01L 27/11573; H01L 29/73; H01L 29/7923
USPC ...................................................... 365/185.3
See application file for complete search history.

(56) References Cited

U.S. PATENT DOCUMENTS

| | | | | |
|---|---|---|---|---|
| 5,290,724 | A | * | 3/1994 | Leach ................ H01L 27/0251 148/DIG. 11 |
| 6,009,033 | A | | 12/1999 | Li et al. |
| 9,025,386 | B1 | | 5/2015 | Iyer et al. |
| 9,208,878 | B2 | | 12/2015 | Iyer et al. |
| 2004/0041206 | A1 | * | 3/2004 | Bhattacharyya ... G11C 16/0466 257/326 |

OTHER PUBLICATIONS

Balaji Jayaraman et al., "80-kb Logic Embedded High-K Charge Trap Transistor-Based Multi-Time-Programmable Memory With No Added Process Complexity", IEEE Journal of Solid-State Circuits, vol. 53, No. 3, Mar. 2018, pp. 949-960.

(Continued)

*Primary Examiner* — Tha-O H Bui
(74) *Attorney, Agent, or Firm* — Michael Le Strange; Andrew M. Calderon; Roberts Calderon Safran & Cole, P.C.

(57) ABSTRACT

The present disclosure generally relates to semiconductor structures and, more particularly, to program and erase memory structures and methods of manufacture. The semiconductor memory includes: a charge trap transistor; and a self-heating circuit which selectively applies voltages to terminals of the charge trap transistor to assist in erase operations of the charge trap transistor.

20 Claims, 6 Drawing Sheets

(56) References Cited

OTHER PUBLICATIONS

Faraz Khan et al., "The Impact of Self-Heating on Charge Trapping in High-k-Metal-Gate nFETs", IEEE Electron Device Letters, vol. 37, No. 1, Jan. 2016, pp. 88-91.
Faraz Khan et al., "Charge Trap Transistor (CTT): An Embedded Fully Logic-Compatible Multiple-Time Programmable Non-Volatile Memory Element for High-k-Metal-Gate CMOS Technologies", IEEE Electron Device Letters, vol. 38, No. 1, Jan. 2017, pp. 44-47.
Yuh-Te Sung et al., "A New Saw-Like Self-Recovery of Interface States in Nitride-Based Memory Cell", IEDM, 2014, pp. 494-497.

* cited by examiner

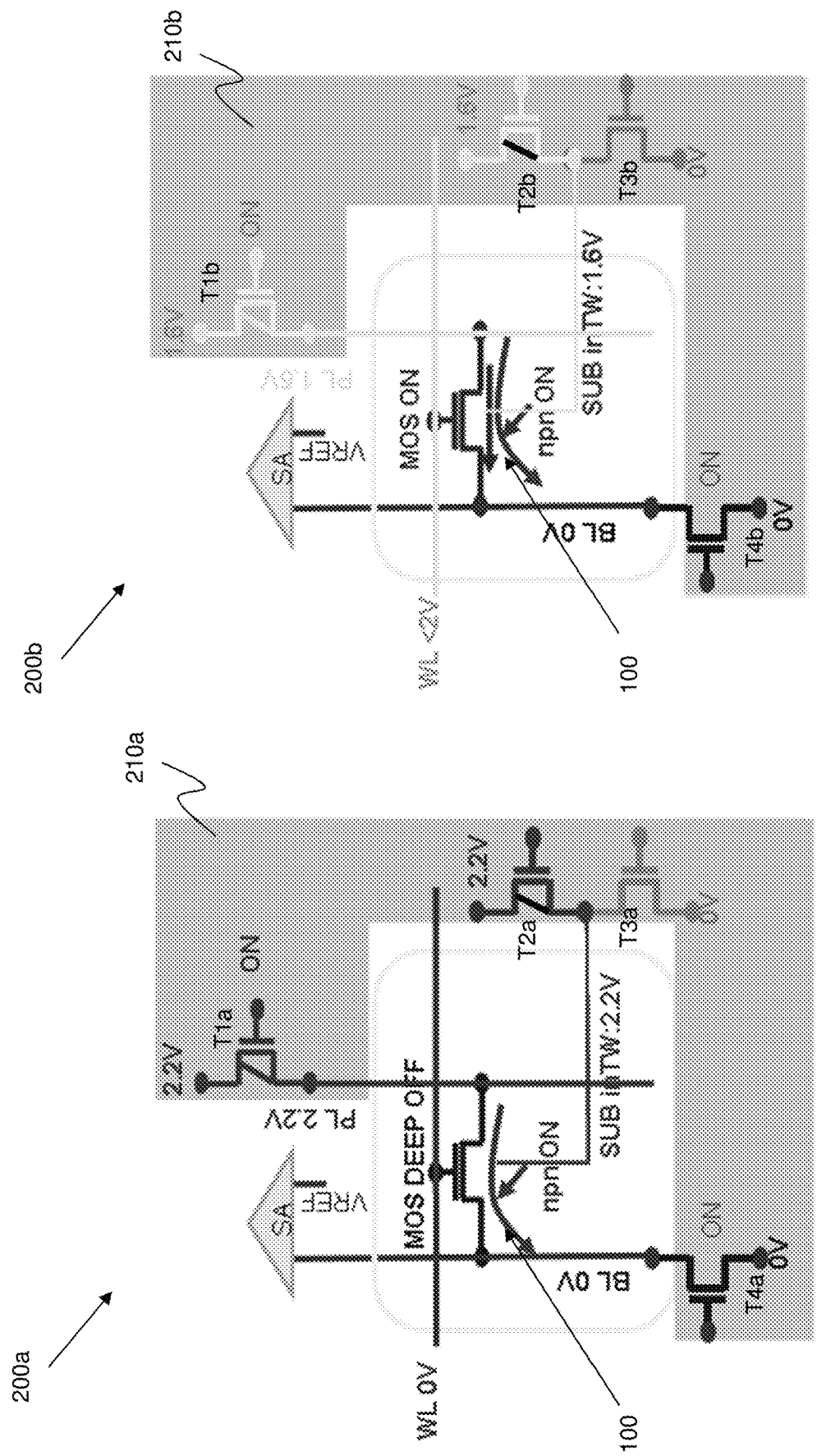

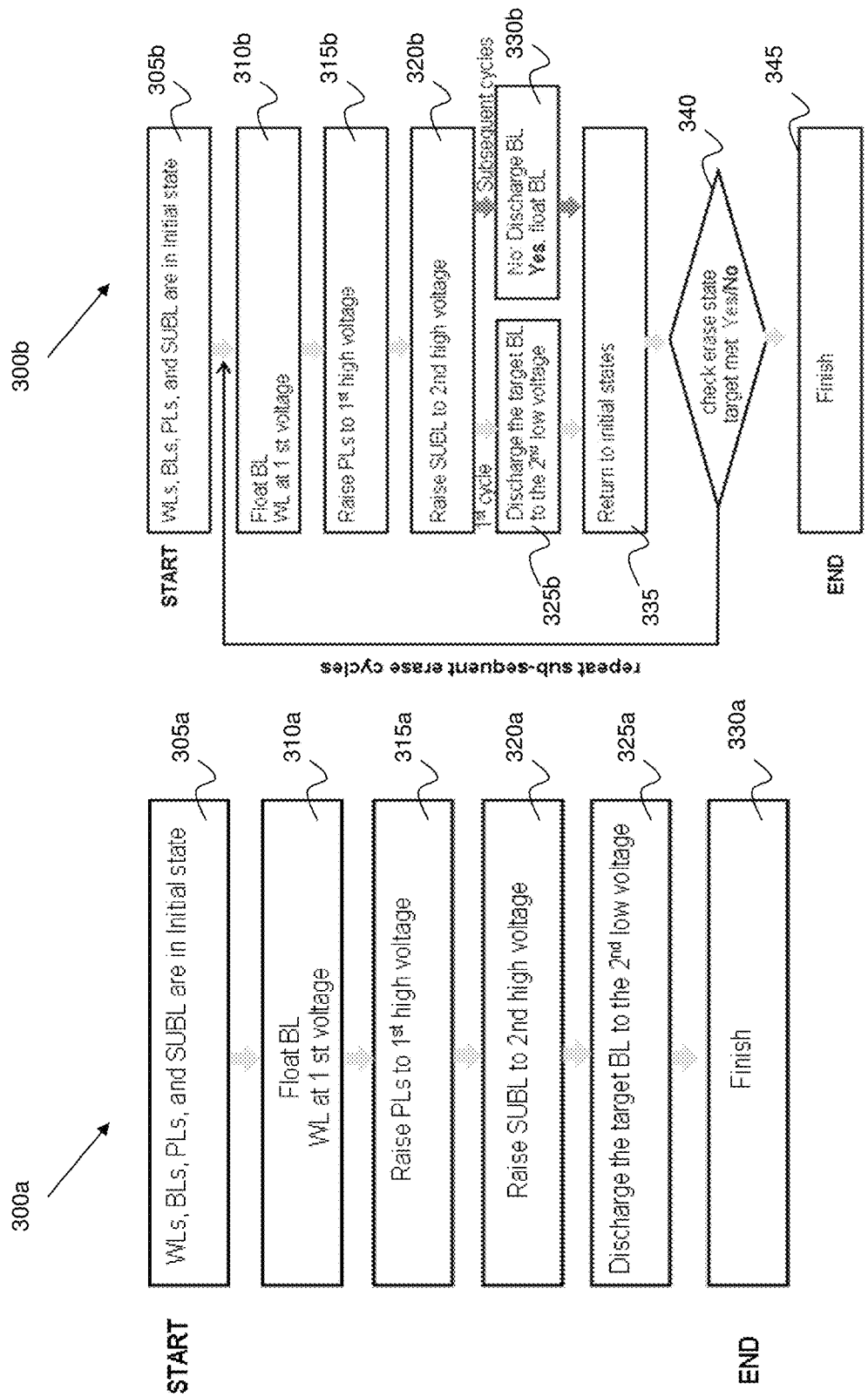

US 10,685,705 B2

PROGRAM AND ERASE MEMORY STRUCTURES

FIELD OF THE INVENTION

The present disclosure generally relates to semiconductor structures and, more particularly, to program and erase memory structures and methods of manufacture.

BACKGROUND

In Charge Trap Transistor (CTT) technologies, N-type high-k metal gate (HKMG) Metal-Oxide-Semiconductor Field-Effect Transistors (MOSFETs) can be used as multi-time programmable memory (MTPM) elements, resulting in a zero-process-adder and zero-mask-adder solution for embedded non-volatile memory applications. Programming can be achieved by electron injection into the high-k dielectric of the N-type MOSFET, with an elevated gate voltage ($V_g$) and a relatively high drain bias of 1.5V (deep-on state of the N-type MOSFET). The memory element can be erased by applying a negative gate-to-drain voltage and/or a negative gate-to-source voltage with a magnitude more than 2.5V (a deep-OFF state of the N-type MOSFET), such that the injected electrons are released from the high-k dielectric.

However, existing erasure operations using a deep-OFF state of the N-Type MOSFET often lead to a relatively insufficient erasure of memory. For example, the erase operation, or threshold voltage ($V_{TH}$) recovery, for certain technology nodes is approximately 50-70%, thereby limiting the endurance required for a MTPM to less than 10× program/erase cycles because of the partial erase. Accordingly, the applications of a CTT MTPM are significantly limited. Furthermore, using a deep-OFF state for an erase operation may cause breakdown of the MOSFET. Although process changes such as the integration of floating gate, magnetic, or resistive elements while optimizing the gate-oxide structure may improve the endurance of a device, the integration of such changes to advanced logic technologies is difficult and expensive, because advanced technologies require FIN structures and multiple phase-shift masks. Therefore, there is a strong demand to realize more than 1000× program/erase cycles of CTT MTPM devices without using additional processes and/or masks in advanced logic technologies.

SUMMARY

In an aspect of the disclosure, a semiconductor memory comprises: a charge trap transistor; and a self-heating circuit which selectively applies voltages to terminals of the charge trap transistor to assist in erase operations of the charge trap transistor.

In an aspect of the disclosure, a semiconductor memory cell comprises: a Metal-Oxide-Semiconductor Filed-Effect Transistor (MOSFET) comprising a substrate, a high-k dielectric metal gate structure, a high-k dielectric, and a source region and a drain region; and a self-heating circuit which controls the substrate, the high-k dielectric metal gate structure, the source region and the drain region, wherein the high-k dielectric of the high-k dielectric metal gate structure releases a trapped charge when heated by the self-heating circuit.

In an aspect of the disclosure, a method comprises: placing a device comprising a plurality of memory cells into a Partially-Deep-OFF (PDOFF) state by applying a voltage bias to the plurality of cells; and heating the device as the device is placed into the PDOFF state by controlling a substrate, a gate structure, a source region and a drain region within each cell of the device.

BRIEF DESCRIPTION OF THE DRAWINGS

The present disclosure is described in the detailed description which follows, in reference to the noted plurality of drawings by way of non-limiting examples of exemplary embodiments of the present disclosure.

FIGS. 2A and 2B show a memory cell and the respective control circuit structures in accordance with aspects of the present disclosure.

FIGS. 3A and 3B show exemplary flowcharts for erase operations in accordance with aspects of the present invention.

DETAILED DESCRIPTION

Figure 1:
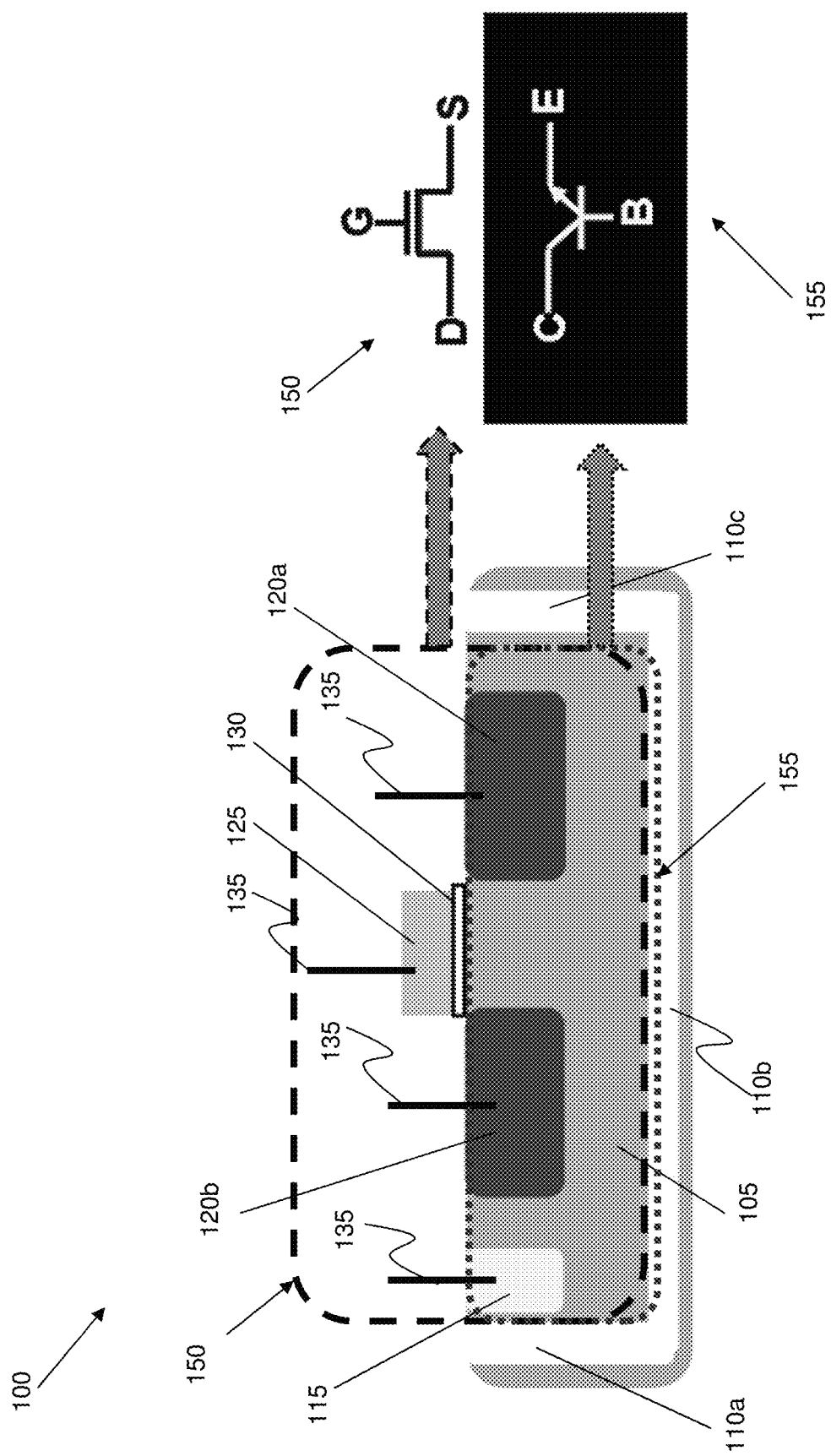
FIG. 1 shows a CTT memory structure having an N-type MOSFET which may simultaneously enable self-heating of the channel region of the N-type MOSFET by using a BJT current, amongst other features, and respective fabrication processes in accordance with aspects of the present disclosure.

The present disclosure generally relates to semiconductor structures and, more particularly, to program and erase memory structures and methods of manufacture. In embodiments, the methods and structures provided herein improve programming and erasing operations in a charge trap transistor (CTT) memory cell. More specifically, the structures and selective control methods provided herein implement a self-heating of the channel region of the N-type MOSFET using a bipolar junction transistor (BJT) current by utilizing the source, the drain, and the substrate of the MOSFET as an emitter, a collector, and a base, respectively, of a BJT, while simultaneously enabling a partially-deep-OFF state of the N-type MOSFET. Advantageously, a de-trapping of approximately 100% of the electrons trapped within the high-k dielectric of the N-type MOSFET occurs, thereby improving the efficiency of erase operations without changing the CMOS process and also alleviating gate oxide reliability concerns by relaxing the requirement of a high gate voltage ($V_g$) during an erase operation. Additionally, the efficiency of program operations is improved by implementation of self-heating by utilizing the source-drain-substrate structure of the MOSFET as a bipolar junction transistor (BJT).

Conventionally, for a CTT memory using a high-k dielectric as a storage element, a negative gate voltage is applied for the erase operation, i.e., de-trapping electrons from the high-k dielectric. More specifically, a negative (lower than −2.5V) gate-to-source voltage and/or gate-to-drain voltage are applied to enable a deep-OFF state of the N-type MOSFET of the cell. However, relying solely on this deep-OFF state condition results in a partial erase, thereby reducing the endurance of the cell and leading to premature failure. Furthermore, using a deep-OFF state where a negative (lower than −2.5V) gate-to-source voltage and/or gate-to-drain voltage is lower than −2.5V for an erase operation may cause a breakdown of the MOSFET.

The structures and methods described herein employ Partially-Deep-OFF (PDOFF) state of the MOSFET such that a negative gate condition of the N-type MOSFET is applied only to the drain side while simultaneously enabling a self-heating to the channel region of the N-type MOSFET by using a BJT current. Utilizing PDOFF conditions with a BJT current for self-heating results in approximately a 100% threshold voltage ($V_{TH}$) recovery, i.e., ~100% erase, along with a recovery of the ON current and gate leakages. The negative gate-to-drain voltage in the PDODD state is ~−2.2V (>10% smaller than the deep-OFF state), thereby avoiding a device breakdown of the N-type MOSFET. In this way, the endurance of the device is improved to greater than 1000× program/erase cycles while achieving approximately 100% de-trapping of the electrons trapped within the high-k dielectric, i.e. ~100% erase efficiency. This allows for the device to be a robust multi-time programmable memory (MTPM).

In embodiments, the n-p-n bipolar junction transistor (BJT) current flows from the drain to the source of the N-type MOSFET by utilizing the n-doped source as an emitter node, the p-doped substrate as a base node, and the p-doped drain as a collector node. The functions of the source and the drain can be interchangeable, i.e., the n-diffusion of the source can also be used as a collector node while the n-diffusion of the drain can be used as an emitter node. The current conduction passes the current in the channel region below the gate structure (not near the drain side sidewall or the source side sidewall only). In this way, the current is allowed to be conducted in the channel region near the gate dielectric, thereby allowing for a self-heating of the high-k dielectric due to self-heating of the channel region. More specifically, the channel region beneath the gate is heated through application of the current to allow for the de-trapping of the electrons trapped within the high-k dielectric of the gate structure.

In addition to improving erase operations, programming operations can also be improved by the structures and processes described herein by allowing for a trapping of the electrons to the high-k dielectric of the N-type MOSFET by using a self-heating approach. Specifically, electrons are more effectively trapped by using a deep ON state of the N-type MOSFET (using an elevated gate voltage and high drain voltage) in combination with the self-heating effect by utilizing n-p-n BJT currents for enabling a self-heating of the channel region of the N-type MOSFET. Due to the improved efficiency, the programming operation can be done using a lower elevated gate voltage, thereby reducing a device breakdown risk.

The benefits of implementing CTT technologies includes no added processes or masks being required, and a fully logic-compatible (process and operation) embedded Multi-Time-Programmable-Memory (MTPM) solution for CMOS technologies and system-on-chip (SoC) products. CTT solutions with the self-heating approach are particularly advantageous for embedded applications, including hardware and data security. Specifically, these applications include system-on-chip (SoC), large integrated ASICS, data security enhancements (e.g., passwords), on-chip reconfigurable encryption key storage, firmware storage, chip IDs, yield improvement, performance tailoring, configuration files, repair data and field configurability, amongst other examples that can benefit from re-writable non-volatile memory.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on semiconductor (such as silicon) wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Advantages of the invention are that the process technology can be exactly same as the technology available used in manufacturing, where the self-heating function is enabled by an additional design structure using n-p-n BJT current by utilizing the n-doped source, the p-doped substrate, and the n-doped drain of an N-type MOSFET structure as the emitter node, the base node, and the collector node, respectively, of a BJT. The functions of the source and the drain can be interchangeable, i.e., the n-diffusion of the source can also be used as the collector node while the n-diffusion of the drain is used as the emitter node.

FIG. 1 shows a CTT memory structure having an N-type-Metal-Oxide-Semiconductor Field-Effect-Transistor (N-type MOSFET) as a charge trap transistor (CTT), which can also enable a bipolar junction transistor (BJT) self-heating function in accordance with aspects of the present disclosure. More specifically, FIG. 1 shows a CTT memory structure (cell) 100 that employs an N-type MOSFET structure as a charge trap transistor, which can be used for enabling a BJT current for employing self-heating assist to improve the programming and erase efficiency within an embedded non-volatile memory (eNVM). The eNVM can retain data for an extended period without a power source. The CTT memory structure 100 includes a substrate 105 which is composed of any suitable material including, but not limited to, Si, SiGe, SiGeC, SiC, GaAs, InAs, InP, etc.

In embodiments, the CTT memory structure 100 comprises an N-type MOSFET structure 150 having a gate structure 125, an n-doped diffusion source region 120a, and an n-doped diffusion drain region 120b, and a p-doped substrate 105. The CTT memory structure 100 also configures an n-p-n BJT structure 155 using the N-type MOSFET's n-doped diffusion source region 120a as an emitter, the n-doped diffusion drain region 120b as a collector and the p-doped substrate 105 as a base. More specifically, a forward biasing of the substrate 105, the source, i.e., source region 120a, and the drain, i.e., drain region 120b, allows for the source to act as an emitter and the drain to act as a collector of a bipolar junction transistor (BJT), i.e., n-p-n BJT structure 155. In embodiments, a triple well, i.e., n-wells 110a, 110c, and the n-plate 110b, isolates the p-doped substrate 105 for biasing. In this way, the source, i.e., source region 120a, and the drain, i.e., drain region 120b, are n-doped and the substrate 105 is p-doped to form an n-p-n junction transistor, i.e., n-p-n BJT structure 155.

The CTT memory structure 100 further includes an isolated p-doped diffusion (p-well) 115 to isolate the p-doped substrate 105 from the p-substrate used for other circuitries. The isolated p-doped diffusion (p-well) 115 is realized by using deep n-wells 110a and 110c in a perimeter of the p-doped diffusion (p-well) 115, and the n-plate 110b at the bottom of the p-doped substrate 105. The n-wells 110a, 110c, and the n-plate 110b are deeply implanted with an n-type species, e.g., phosphorus. This allows the substrate 105 as a MOS or a base of an n-p-n BJT structure 155 to be biased to the target voltage without affecting other circuits.

More specifically, for the N-type MOSFET, a gate structure 125 and a corresponding gate dielectric 130 are formed over the substrate 105. The gate structure 125 can be fabricated using any known gate formation processes, e.g., replacement gate fabrication processes or gate first processes as is known in the art. In embodiments, the gate structure 125 is a high-k metal gate with a high-k dielectric material for the gate dielectric 130. For example, the material of the gate dielectric 130 can be, e.g., hafnium based dielectrics. In further embodiments, the high-k dielectric materials can include, but are not limited to: $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. Accordingly, the eNVM employs the CTT memory structure (cell) 100 which comprises the high-k dielectric N-type MOSFET having a high-k metal gate structure 125, an n-doped diffusion source region 120a, an n-doped diffusion drain region 120b and a p-doped substrate 105 in a triple well, i.e., n-wells 110a, 110c, and the n-plate 110b. In this way, the charge trap transistor, i.e., CTT memory structure 100, comprises a substrate 105, a gate, i.e., gate structure 125, a drain, i.e., drain region 120b, and a source, i.e., source region 120a. Specifically, the structures and processes described herein a Metal-Oxide-Semiconductor Filed-Effect Transistor (MOSFET) comprising a substrate 105, a high-k dielectric metal gate structure 125, a high-k dielectric, i.e., gate dielectric 130, and a source region 120a and a drain region 120b, and a self-heating circuit which controls the substrate 105, the high-k dielectric metal gate structure 125, the source region 120a and the drain region 120b, wherein the high-k dielectric, i.e., gate dielectric 130, of the high-k dielectric metal gate structure 125 releases a trapped charge when heated by the self-heating circuit.

Table 1 summarizes the voltage conditions for self-heated erase and programming operation discussed next.

and $2^{nd}$ high voltages may be the same and preferably set at 2.2V, and the $1^{st}$ and $2^{nd}$ low voltages may be the same, and preferably set at 0V. Raising the p-doped substrate 105 voltage turns on the p-n junction coupling to the p-doped substrate 105 and the n-doped diffusion source region 120a, which further enables an n-p-n BJT current from the n-doped drain region 120b to 0V for the n-doped diffusion source region 120a because the n-doped diffusion source region 120a, the p-doped substrate 105, and n-doped drain region 120b of the N-type MOSFET act as emitter, base, and collector for the BJT structure 155, respectively.

The BJT currents from the drain region 120b to the source region 120a and the substrate 105 to the source region 120a both heat the MOSFET from underneath, i.e., heat the channel region beneath the gate structure 125 and the gate dielectric 130. By heating the channel region, the gate dielectric 130 becomes heated, thereby increasing the efficiency of program operations and erase operations. In embodiments, the channel region can be heated to a temperature >260° C., for example. More specifically, the MOSFET is heated to a temperature in a range greater than 260° C. by the self-heating circuit.

As an exemplary erase operation, the N-type MOSFET in the CTT memory structure 100 is in Partially-Deep-OFF (PDOFF) state by raising the drain region 120b to a $1^{st}$ high voltage (~2.2V), while keeping the gate structure 125 at a $1^{st}$ low voltage (0V) and the source region (S/E) 120a at a $2^{nd}$ low voltage (0V), respectively. When the substrate (SUB/B) 105 is raised to a $2^{nd}$ high voltage (~2.2V), the n-doped diffusion source region 120a, the p-doped substrate 105, and the n-doped drain region 120b act as emitter, base, and collector, respectively, resulting in a large NPN BJT currents from the p-doped substrate (SUB/B) 105 to the source region (S/E) 120a, and from the drain region (D/C) 120b to the source region (S/E) 120a. More specifically, the source region 120a and the drain region 120b are n-doped and the substrate 105 is p-doped. In this way, the trapped electrons are released by using a PDOFF state of the memory cells, i.e., CTT memory structures 100, and a self-heating current flow from the drain region 120b to the source region 120a using n-diffusion of the source region 120a, p-diffusion of the substrate 105 and n-diffusion of the drain region 120b of the charge trap transistor, i.e., CTT memory structure 100.

During a self-heating operation, the N-type MOSFET is in a PDOFF state, resulting in de-trapping of the electrons from the gate dielectric 130. More specifically, when the gate

TABLE 1

| Condition Mode | G (WL in the array) | D/C (PL in the array) | S/E (BL in the array) | SUB/B (SUB in array) | N-type MOSFET | BJT |
|---|---|---|---|---|---|---|
| Heated Erase | 0 (1st low Vol) | 2.2 (1st high Vol) | 0 (2nd low Vol) | 2.2 (2nd high Vol) | OFF | ON |
| Heated Program | 2.0 ($3^{rd}$ high Vol) | 1.6 (4th high Vol) | 0 (3rd low Vol) | 1.6 ($5^{th}$ high Vol) | ON | ON |
| Stand-by state | GND (0 V) | GND (0 V) | GND (0 V) | GND (0 V) | OFF | OFF |

Contacts 135 extend to the source region 120a, the drain region 120b, and the gate structure 125, respectively. The contacts 135 coupling to the p-doped diffusion 115 are utilized to selectively apply voltages to the p-doped substrate 105. Unlike conventional erase operations using a deep-OFF state of the N-type MOSFET, the drain region (D/C) 120b and substrate (SUB/B) 105 are raised to a $1^{st}$ high voltage and a $2^{nd}$ high voltage, respectively, while keeping the gate structure (G) 125 and the source region 120a (S/E) at $1^{st}$ and $2^{nd}$ low voltages, respectively. The $1^{st}$ structure 125 is at a low voltage with a high voltage drain region 120b, it repels the charges out of the channel region, causing an erase. Further, as discussed previously, the BJT current self-heats the channel of the N-type MOSFET underneath the gate structure 125, and particularly, the gate dielectric 130, improving the erase efficiency due to the self-heating. This PDOFF state with BJT self-heating approach achieves approximately 100% threshold voltage ($V_{TH}$) recovery, i.e., 100% erase, along with a recovery of the ON current and gate leakages to the initial values before the programming. Since the PDOFF condition during the erase operation requires a smaller negative voltage (more than 10% smaller) than the conventional deep-OFF erase condition, the device breakdown risk is significantly reduced. In this way, the structures and processes described herein provide the steps of placing a device comprising a plurality of memory cells into a Partially-Deep-OFF (PD-OFF) state by applying a voltage bias to the plurality of cells, and heating the device, i.e., CTT memory structure 100, as the device is placed into the PDOFF state by controlling a substrate 105, a gate structure 125, a source region 120a and a drain region 120b within each cell of the device, i.e., CTT memory structure 100. In this way, the endurance of the device is improved to greater than 1000× program/erase cycles while achieving approximately 100% de-trapping of the electrons trapped within the high-k dielectric, i.e., the gate dielectric 130. This allows for a robust embedded non-volatile memory (eNVM) which is re-writable.

In further embodiments, the efficiency of a programming operation can also be enhanced by the self-heating. During an exemplary programming operation, the voltage of the gate structure 125 is raised to a $3^{rd}$ high voltage (~2V), while keeping the source region (S/E) 120a and the drain region (D/C) 120b at a $3^{rd}$ low voltage (0V) and a $4^{th}$ high voltage (1.6V), respectively. This results in deeply turning ON the N-type MOSFET (deep-ON state), flowing the N-type MOSFET current from the drain region (D/C) 120b to the source region (S/E) 120a. This N-type MOSFET current with the gate voltage ($V_g$) at a $3^{rd}$ high voltage (2V) attracts the electrons and pulls them into the gate dielectric 130. Further, when the substrate (S/B) 105 is raised to the $5^{th}$ high voltage (1.6V), the NPN BJT current flows from the drain region (D/C) 120b to the source region (S/E) 120a, and the substrate (S/B) 105 to source region (S/E) 120a. This NPN BJT current self-heats the channel region of the N-type MOSFET, in turn improving the electron trapping efficiency, i.e., the programming efficiency. Specifically, the heating of the channel region underneath the gate dielectric 130 also heats the gate dielectric 130, causing the charges to be trapped easier since charges can move into the gate dielectric 130 easier as compared to when the channel region under the gate dielectric 130 and the gate dielectric 130 are not heated, i.e., without using the NPN BJT current. Because of this self-heating assist, the gate voltage for programming ($3^{rd}$ high voltage) may be reduced, in turn reducing the device breakdown risk, while reducing a programming time.

FIG. 2A illustrates circuit 200a for erase operations in memory cells with a self-heating assist approach. Specifically, the features of the circuit 200a can apply the currents and voltages discussed in the examples of FIG. 1 through the self-heating circuit 210a. More specifically, the self-heating circuit 210a includes programming-line (PL) switch transistors T1a to raise the PL voltage to the $1^{st}$ high voltage. The self-heating circuit 210a also includes the substrate-line (SUB) switch transistors T2a and T3a to control the SUB voltage to $2^{nd}$ high voltage or GND (0V). The self-heating circuit 210a further includes the bitline (BL) control switch transistor T4a to force the BL to the $2^{nd}$ low voltage.

In embodiments, each memory cell consists of a N-type MOSFET as a charge-trap-transistor (CTT), i.e., the CTT memory structure 100, and a self-heating circuit 210a which comprises transistors T1a-T4a. The CTT memory structure 100 is controlled by a bitline (BL), wordline (WL), programming-line (PL), and substrate-line (SUB), all coupled to the contacts 135 of the substrate (SUB/B) 105, the source region (S/E) 120a and the drain region (D/C) 120b, and the gate structure (G) 125 as shown in FIG. 1. Specifically, referring to FIGS. 1, 2A, and 2B, a BL is coupled to the source region 120a, the PL is coupled to the drain region (D/C) 120b, the WL is coupled to the gate structure (G) 125, and the SUB line is coupled to the substrate (SUB/B) 105 through the p-doped diffusion 115 in a p-well. In this way, the structures and processes described herein provide a charge trap transistor, i.e., the CTT memory structure 100, and a self-heating circuit 210a which selectively applies voltages to terminals of the charge trap transistor to assist in erase operations of the charge trap transistor.

As shown in Table 1, during an erase operation, a WL is kept at a $1^{st}$ low voltage level, a PL is raised to the $1^{st}$ high voltage by activating the switch transistor T1a, a BL is forced to the $2^{nd}$ low voltage by turning on the transistor T4a. NPN BJT current flows for self-heating assist when the SUB is raised to a $2^{nd}$ high voltage by turning on the transistor T2a. In the following discussion, the first and second low voltages are both at 0V, and the first and second high voltage are both at 2.2V.

Continuing with the erase operation example discussed in FIG. 1 and Table 1, the N-type MOSFET, i.e., the CTT memory structure 100, is in a PDOFF state by keeping the WL at 0V, with the BL and the PL set at 0V and 2.2V, respectively. When the SUB line is raised to 2.2V by turning on the transistor T2a, the NPN BJT current flows because the source region (S/E) 120a coupling to the BL is at 0V, and the drain region (D/C) 120b coupling to the PL is at 2.2V. This results in self-heating of the channel region of the target N-type MOSFET, while simultaneously enabling a PDOFF state to the N-type MOSFET, making 100% $V_{TH}$ recovery (100% erase) possible. More specifically, in the erase operation, the self-heating circuit 210a pulls the gate, i.e., gate structure 125, and the source, i.e., source region 120a, down to first and second low voltages, respectively, while raising the drain, i.e., drain region 120b, and the substrate 105, respectively to first and second high voltages such that the trapped electrons in a gate dielectric 130 of the charge trap transistor, i.e., the CTT memory structure 100, are released using a partially-deep OFF state of the charge trap transistor, i.e., the CTT memory structure 100, while simultaneously enabling a self-heating operation.

FIG. 2B illustrates circuit 200b for programming operations in memory cells with a self-heating assist approach. Specifically, the features of the circuit 200b can apply the currents and voltages discussed in the examples of FIG. 1 through the self-heating circuit 210b. More specifically, the self-heating circuit 210b includes the PL switch transistor T1b to raise the voltage of the PL to the $4^{th}$ high voltage. The self-heating circuit 210b also includes the SUB switch transistors T2b and T3b to control the SUB voltage to a $5^{th}$ high voltage or GND (0V). The self-heating circuit 210b further includes the BL control switch transistor T4b to force the BL to the $2^{nd}$ low voltage. In this way, the self-heating circuit 210b selectively applies the voltages to the gate, i.e., gate structure 125, to assist in a programming operation of the charge trap transistor, i.e., CTT memory structure 100. More specifically, the structures and processes described herein provide a SUB line connected to the substrate 105, a WL connected to the gate, i.e., gate structure 125, a BL connected to the source, i.e., source region 120a, and a PL connected to the drain, i.e., drain region 120b, wherein the self-heating circuit 210b comprises a plurality of transistors, i.e., transistors T1b-T4b, which selectively apply voltages to the SUB line, the WL, the BL and the PL.

As shown in Table 1, during a programming operation, a WL is raised to a $3^{rd}$ high voltage level, a PL is raised to the $4^{th}$ high voltage by activating the switch transistor T1b, a BL is forced to the $3^{rd}$ low voltage by turning the T4b. NPN BJT current flows for self-heating assist when the SUB is raised to the $5^{th}$ voltage by turning on the transistor T2b. In the following discussion, the $3^{rd}$ low voltages are 0V, and the $3^{rd}$ high voltage is 2V, and $4^{th}$ and $5^{th}$ high voltages are both 1.6V.

Continuing with the program operation example discussed in FIG. 1 and Table 1, the PL coupling to the drain region (D/C) 120b is raised to 1.6V by activating the transistor T1b. The BL coupling to the source region (S/E) 120a is pulled down to 0V by activating the transistor T4b. The WL coupling to the gate structure (G) 125 is then raised to 2V, turning on the N-type MOSFET. Due to the N-type MOSFET current flow, the electrons are attracted and pulled into the gate dielectric 130, thereby performing a programming operation. To enable self-heating assist during programming, the SUB line coupling to the substrate (SUB/B) 105 is also raised to 1.6V by activating the transistor T2b. This results in flowing a large NPN BJT current underneath the channel region of the N-type MOSFET for self-heating. Specifically, the heating of the channel region causes the gate dielectric 130 to be heated, thereby causing electrons to be trapped easier since charges can move into the gate dielectric 130 easier than when the gate dielectric 130 is not heated without using NPN BJT current. In this way, in the programming operation, the self-heating circuit 210b pulls the substrate 105 to a voltage such that electrons are trapped within a gate dielectric 130 of the charge trap transistor, i.e., CTT memory structure 100, by using an ON state of the charge trap transistor, i.e., CTT memory structure 100.

The above voltages discussed in FIGS. 1, 2A, 2B and Table 1 are exemplary, and are not intended to be limiting. For example, a P-type MOSFET may be used as a charge trap transistor (CTT) and a p-n-p BJT may be used for the self-heating assist. More specifically, the source region 120a can be a p-doped diffusion source region, the drain region 120b can be a p-doped diffusion drain region 120b and the substrate 105 can be an n-doped substrate. In this way, the structures and processes described herein can be applied for P-type MOSFETs as well. More specifically, the source, i.e., source region 120a, and the drain, i.e., drain region 120b, are p-doped and the substrate 105 is n-doped to form a p-n-p junction transistor. In this way, the self-heating circuit 210a provides the self-heating effect due to an n-p-n or p-n-p BJT current flowing from the drain, i.e., drain region 120b, to the source, i.e., source region 120a, using a diffusion of the source, i.e., source region 120a, as an emitter node, the substrate 105 and a diffusion of the drain, i.e., drain region 120b, as a collector node of the charge trap transistor i.e., CTT memory structure 100, to de-trap the electrons that are trapped in the gate dielectric 130.

Voltages may be increased or decreased depending on the materials being used, e.g., material of the gate dielectric 130. $1^{st}$, $2^{nd}$, and $3^{rd}$ low voltages may be the same, different, or preferably GND (0V) as discussed in the example. Similarly, the $1^{st}$ and $2^{nd}$ high voltages may be the same, different, or preferably 2.2V, and the $4^{th}$ and $5^{th}$ high voltages may be the same, different, or preferably 1.6V as discussed in the example. In further embodiments, the source region 120a and the drain region 120b may be swapped. The most important requirement is that the voltages should be below values which would cause dielectric breakdown, while also enabling sufficient self-heating during erase, programming, or both. In this way, there is a significant reduction in time-dependent dielectric breakdown (TDDB) rates while still being able to trap a sufficient charge in the device to shift its threshold. More specifically, the voltages are high enough to trap charges but low enough to not cause dielectric breakdown. Using the self-heating approach reduces the high voltage requirement, thereby reducing the TDDB risks.

In further embodiments, multiple CTT memory cells can be implemented in an array. The multiple CTT transistors can be arranged in a plurality of columns controlled by the corresponding BLs and PLs, with one row coupling to the WL. In this configuration, a bitmask for programming and erase is achieved by floating the BL. More specifically, the structures and processes described herein comprise floating a bitline while keeping a word line at a first low voltage of 0V, raising a programming line to a first high voltage of 2.2V and raising a substrate line to second high voltage of 2.2V. Additionally, the PLs may be shared by the plurality of columns. Optionally, a PL can be assigned in each column, and also be in a floating state during the erase for unselected columns.

Figure 2C:
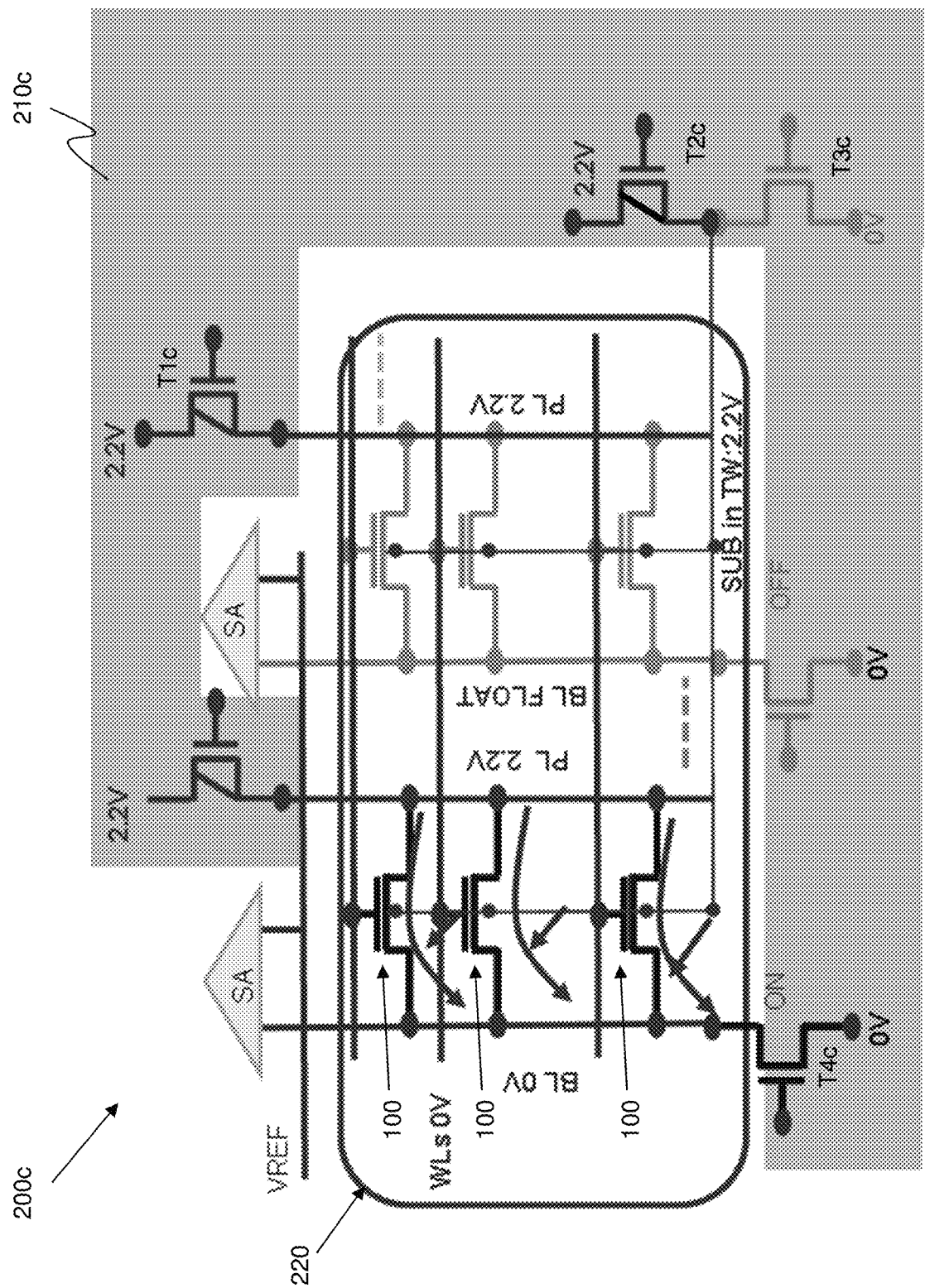
FIG. 2C shows a memory array consisting of plurality of memory cells and respective control circuits in accordance with aspects of the present disclosure.

FIG. 2C illustrates the circuits for erase operations in a memory array having a plurality of CTT memory cells. The circuit 200c consists of CTT memory array 220, comprising sense amplifiers (SA) and self-heating circuit 210c. More specifically, the CTT memory array 220 consists of a plurality of CTT memory cells (100) arranged in 2D matrix, which can have a plurality of rows, with each row being controlled by a corresponding WL, and a plurality of columns, with each column being controlled by a corresponding BL and PL. During the erase operation, all WLs in the CTT memory array 220 are kept at the first low voltage (0V). In the array configuration, the cells coupled to selected columns are simultaneously erased by activating the transistor T4c in the corresponding column when the corresponding PL and the substrate (SUB) are raised to $1^{st}$ and $2^{nd}$ high voltages by activating T1c and T2c, respectively, while not activating the transistor T3c. This results in forcing the selected BL to the $2^{nd}$ low voltage (0V), enabling the BJT current for self-heating. The cells coupled to unselected columns float the BL by disabling the transistor T4c, resulting in a masking erase operation. In embodiments, the PLs may be shared with a plurality of columns. Optionally, a PL can be assigned in each column, and also be in a floating state during the erase for unselected columns.

FIGS. 3A and 3B illustrate exemplary flowcharts for erase operations for the structures and methods described in FIGS. 1, 2A, 2B, and 2C. Specifically, both erase operations 300a, 300b start at steps 305a, 305b, with the WLs, BLs, PLs and the SUB lines being in an initial state, e.g., 0V. At steps 310a, 310b the BL is floated, and the WL is set to a first low voltage, e.g., 0V. At steps 315a, 315b the PLs are raised to a first high voltage, e.g., 2.2V, while at steps 320a, 320b the SUB line is raised to a second high voltage, e.g., 2.2V. At steps 325a, 325b the targeted BL is forced to a second low voltage, e.g., 0V.

In FIG. 3A, the erase operation 300a finishes at step 330a following step 325a, while in FIG. 3B the erase operation 300b offers an over erase protection of the device by providing further steps. Specifically, referring to FIG. 3B at step 335, the WLs, BLs, PLs and the SUB lines are returned to their pre-determined initial states, e.g., 0V. At step 340, there is a checking of an erase state target which indicates how much memory has been erased. If the erase state target is met, i.e., a YES because a 100% erase occurs, the erase operation 300b finishes at step 345. However, if the erase state target is not met, i.e., a NO response is selected, the erase operation 300b starts over again with steps 305b-320b. For these subsequent program/erase cycles for other cells not meeting the target, at step 330b, there is no discharge of the BL if the corresponding cell has met the target. More specifically, the structures and processes described herein comprise discharging the bitline for a target column to a second low voltage of 0V such that trapped electrons of the trapped charge in the high-k dielectric of the transistor are released. In this way, the structures and processes described herein comprise enabling an over erase protection including multiple erase cycles, each cycle comprising: after enabling the floating of the BL while keeping the WL at 0V, the raising of the PL, the raising of the SUB line and the discharging of the BL for the target column to the 2nd low voltage of 0V, returning the WL, BL, PL and SUB line to the predetermined initial state; and checking an erase state of the device, i.e., CTT memory structure 100.

At step 340, if all cells have met the erase state target, the processes finishes at step 345, returning all voltages WLs, BLs, PLs, and SUBL at the initial state e.g. 0V. However, if the erase state target is not met, erase operation 300b starts over again until all cells to be erased have met the erase state target. Once the erase state target is met for all erased cells, the processes finishes with step 345. The application of voltages to the WL, the BL, the PL and the SUB line can be controlled by the self-heating circuit 210.

Figure 4A:
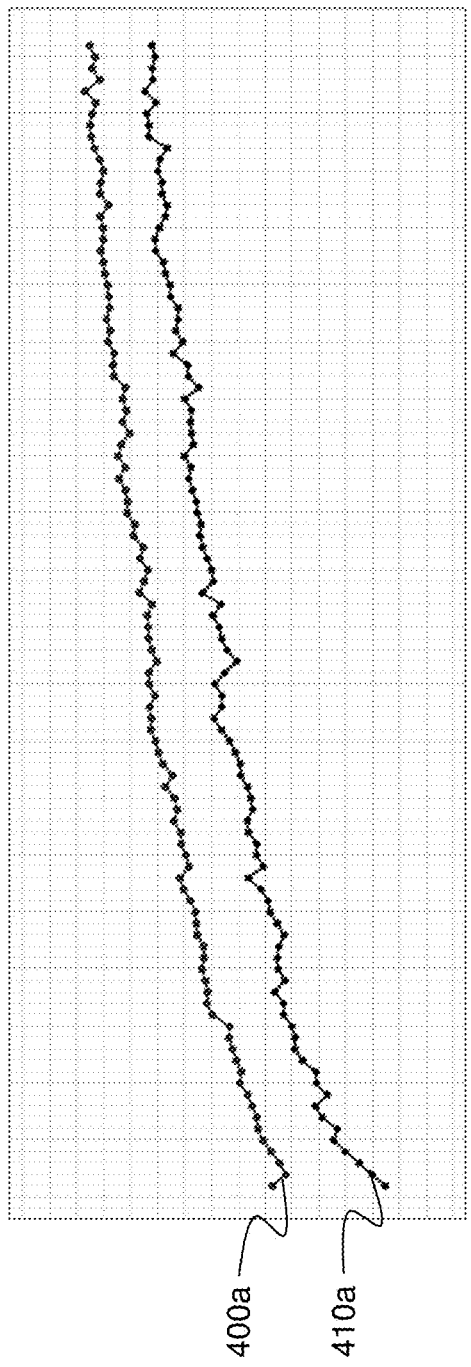
FIGS. 4A and 4B show various results for program/erase cycles in accordance with aspects of the present disclosure.
Figure 4B:
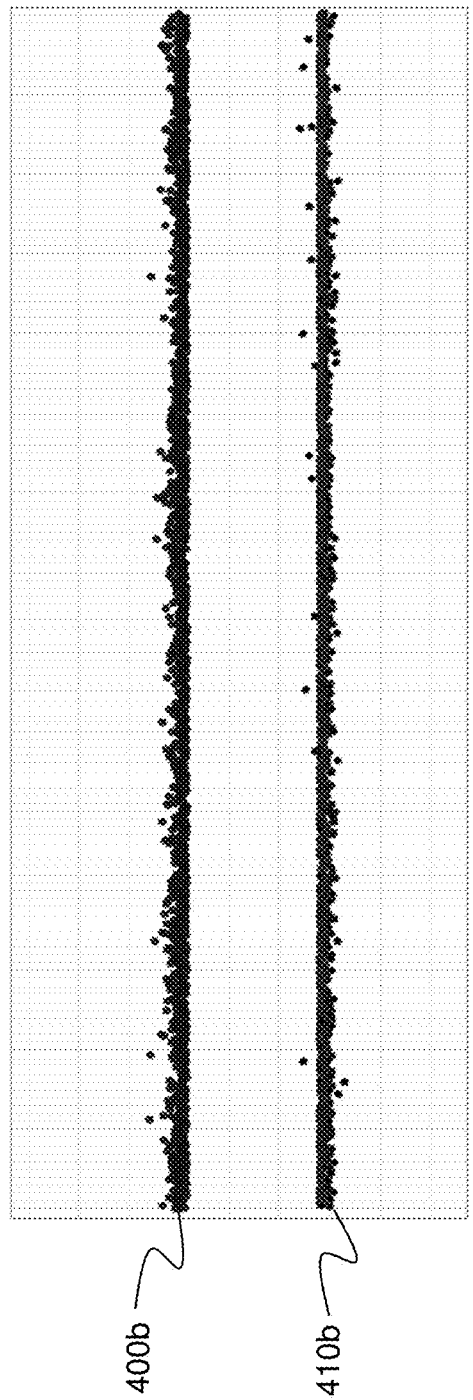

FIGS. 4A and 4B illustrate the results of program/erase cycles. Specifically, FIG. 4A shows the issues using conventional approaches (negative voltage only erase approach) which result from a partial erase. More specifically, line 400a represents the post program device threshold voltages, while line 410a represents the post erase device threshold voltages. As shown in FIG. 4A, the memory window (the space between line 410a and the reference threshold voltage which is the first point on line 400a) continues to decrease as subsequent program/erase cycles are performed. Specifically, the memory window continues to decrease because each partial erase (under-erase) of the memory causes the post erase device threshold voltages represented in line 410a to increase after each subsequent cycle. The under-erase after each cycle leads to an over-program in the subsequent cycle (i.e. increase in post program device threshold voltages) and this "walk up" of the post erase and post program device threshold voltages will continue to cause the memory window to narrow down, until eventually the post erase device threshold voltage represented in line 410a is equal to or greater than the reference threshold voltage which is the first point on line 400a, i.e., until the memory window has completely collapsed. This will prevent the ability to distinguish between the programmed and erased devices, leading to a premature failure.

FIG. 4B shows the benefits of a full erase, i.e., 100% erase, provided by the structures and processes described herein. More specifically, line 400b represents the post program device threshold voltages, while line 410b represents the post erase device threshold voltages. As shown in FIG. 4B, the window between lines 400b, 410b remains flat, indicating there is no "walk up" of the post erase device threshold voltages. This allows for the endurance of the device to increase to greater than 1000× program/erase cycles.

Figure 5A:
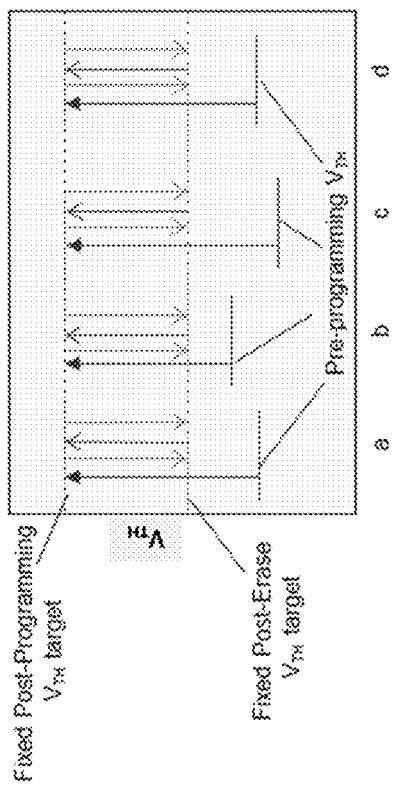
FIG. 5A shows pre-program, post-program, and post-erase $V_{TH}$ values of CTT memory devices cycled using a fixed post-program $V_{TH}$ target followed by a 100% $V_{TH}$ recovery during the erase operation.

The discussion until now is to enable a 100% erase, which requires to return the CTT memory characteristics to the initial point (before a $1^{st}$ programming). FIG. 5A shows pre-program and post-erase $V_{TH}$ values, and post-program $V_{TH}$ values of CTT memory devices cycled using a fixed post-program $V_{TH}$ followed by a 100% $V_{TH}$ recovery during the erase operation. As shown, the cells a, b, c, d initially have a different $V_{TH}$ because of natural distribution in manufacturing. The program operation includes an over-write protection with the target $V_{TH}$, resulting in almost an equal $V_{TH}$ value after the programming operation. The erase operation releases all the trapped charges, resulting in recovering the $V_{TH}$ to the initial value. However, this 100% recovery may not be necessary, because the key to improve the program/erase cycling endurance is not to return to the initial point, but instead to return to the same point during subsequent programming and erase cycles. Therefore, optionally, the post erase $V_{TH}$ may be higher than the initial pre-programmed state to compensate for an initial operation point offset of multiple cells. This offset cancelation may be a more advantageous approach, which can be realized by having a fixed erase target (instead of a 100% erase target) in the step 340 in the erase operation 300b.

Figure 5B:
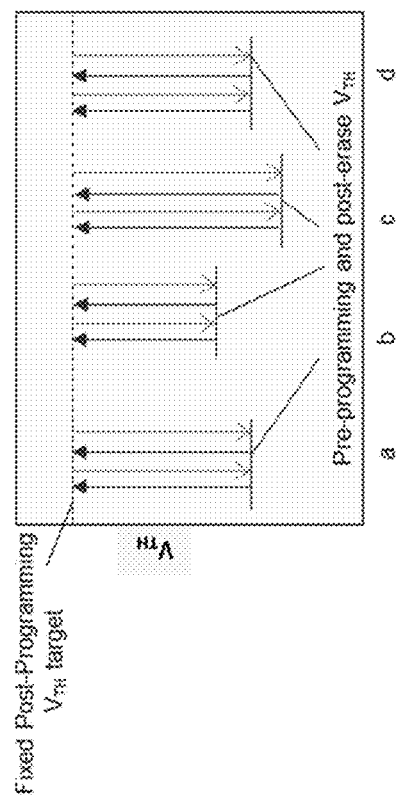
FIG. 5B shows pre-program, post-program, and post-erase $V_{TH}$ values of CTT memory devices cycled using a fixed post-program $V_{TH}$ target followed by a fixed post-erase $V_{TH}$ target, to compensate for initial device-to-device $V_{TH}$ variation.
Figure 5C:
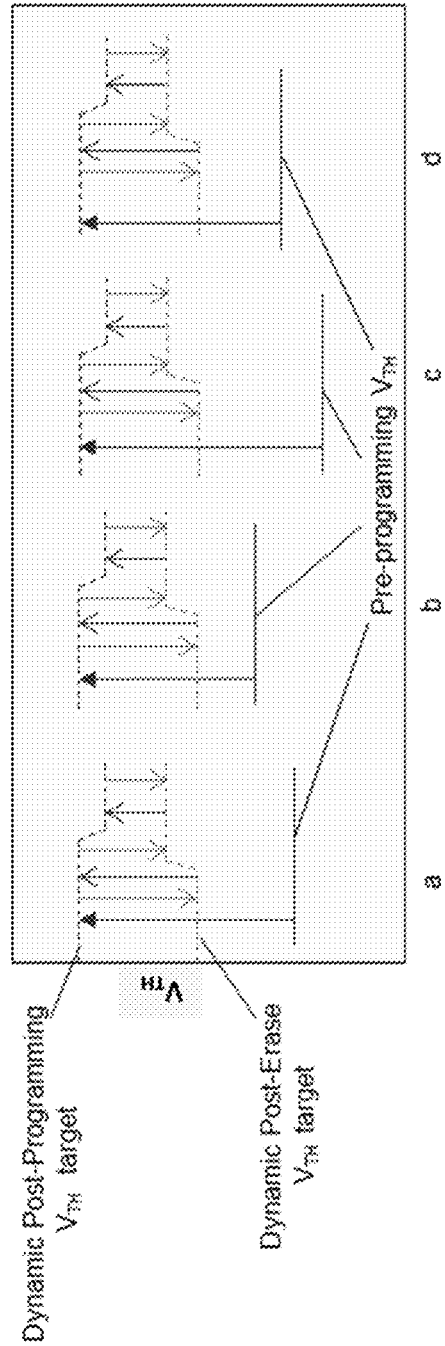
FIG. 5C shows pre-program, post-program, and post-erase $V_{TH}$ values of CTT memory devices cycled using dynamic post-program and post-erase $V_{TH}$ targets.

FIG. 5B shows the erase operation with the pre-programming $V_{TH}$ values with the offset cancelation using a fixed post erase $V_{TH}$ target. The erase operation releases trapped charges until the target post erase $V_{TH}$ value is met, resulting in recovering the $V_{TH}$ to the target values for all cells. In this way, all post program and post erase $V_{TH}$ values are equalized for all the cells, in contrast to the 100% erase approach. FIG. 5C shows an additional approach with the pre-programming $V_{TH}$ values where the target post program and post erase $V_{TH}$ values are dynamically changed instead of being fixed as in the case of the examples shown in FIGS. 5A and 5B. By using this approach, further optimization of the programming and erase operations may be possible. For example, during manufacturing testing, a higher target for the signal margin can be used and that target can then be reduced for field operation. This reduction of target signal margin can lead to improved reliability and endurance.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A semiconductor memory, comprising:
   a charge trap transistor, including a source and a drain formed in a substrate and separated from one another by a channel region in the substrate, and a metal gate formed over the channel region, wherein the metal gate is separated from the channel region by a gate dielectric configured to trap electrons in the gate dielectric; and
a self-heating circuit, including a doped region in the substrate, adjacent to the charge trap transistor and configured to selectively apply forward biasing to terminals of the charge trap transistor to heat the gate dielectric to assist in erase operations of electrons trapped in the gate dielectric of the charge trap transistor.

2. The semiconductor memory of claim 1, wherein the forward biasing of the substrate via the doped region in the substrate biases the source to act as an emitter and the drain to act as a collector of a bipolar junction transistor (BJT) in the substrate.

3. The semiconductor memory of claim 1, wherein the source and the drain are n-doped and the substrate is p-doped to form an n-p-n junction transistor.

4. The semiconductor memory of claim 1, wherein the self-heating circuit selectively applies the voltages to the gate to assist in a programming operation of the charge trap transistor.

5. The semiconductor memory of claim 1, wherein the source and the drain are p-doped and the substrate is n-doped to form a p-n-p junction transistor.

6. The semiconductor memory of claim 1, wherein in the erase operation, the self-heating circuit pulls the gate and the source down to first and second low voltages, respectively, while raising the drain and the substrate respectively to first and second high voltages such that the trapped electrons in the gate dielectric of the charge trap transistor are released using a partially-deep OFF state of the charge trap transistor while simultaneously enabling a self-heating operation.

7. The semiconductor memory of claim 6, wherein the self-heating circuit provides the self-heating effect due to n-p-n or p-n-p BJT current flowing from the drain to the source using a diffusion of the source as an emitter node, the substrate and a diffusion of the drain as a collector node of the charge trap transistor to de-trap the electrons that are trapped in the gate dielectric.

8. The semiconductor memory of claim 1, wherein in the programming operation, the self-heating circuit pulls the substrate to a voltage such that electrons are trapped within a gate dielectric of the charge trap transistor by using an ON state of the charge trap transistor.

9. The semiconductor memory of claim 8, further comprising a SUB line connected to the substrate, a WL connected to the gate, a BL connected to the source and a PL connected to the drain, wherein the self-heating circuit comprises a plurality of transistors which selectively apply voltages to the SUB line, the WL, the BL and the PL.

10. The semiconductor memory of claim 1, further comprising a contact connected to the doped region in the substrate and configured to selectively supply the forward biasing to the doped region in the substrate.

11. The semiconductor memory of claim 10, wherein the source region and the drain region are n-doped and the substrate is p-doped.

12. The semiconductor memory of claim 11, wherein the doped region is p-doped.

13. The semiconductor memory of claim 1, wherein the channel region of the charge trap transistor under the gate dielectric is heated by the self-heating circuit to heat the gate dielectric via heating the channel region.

14. The semiconductor memory of claim 1, wherein the gate dielectric is comprised of a hafnium-based dielectric.

15. The semiconductor memory of claim 1, wherein the gate dielectric is comprised of at least one selected from a group consisting of: $Al_2O_3$; $Ta_2O_3$; $TiO_2$; $La_2O_3$; $SrTiO_3$; $LaAlO_3$; $ZrO_2$; $Y_2O_3$; and $Gd_2O_3$.

16. The semiconductor memory of claim 1, further comprising;
a contact connected to the doped region in the substrate and configured to selectively supply the forward biasing to the doped region in the substrate; and
a SUB line connected to the substrate, a WL connected to the gate, a BL connected to the source and a PL connected to the drain, wherein the self-heating circuit comprises a plurality of transistors which selectively apply voltages to the SUB line, the WL, the BL and the PL,
wherein the source and the drain are n-doped and the substrate is p-doped to form an n-p-n junction transistor.

17. The semiconductor memory of claim 16, wherein the self-heating circuit selectively applies the voltages to the gate to assist in a programming operation of the charge trap transistor.

18. The semiconductor memory of claim 17, wherein in the erase operation, the self-heating circuit pulls the gate and the source down to first and second low voltages, respectively, while raising the drain and the substrate respectively to first and second high voltages such that the trapped electrons in the gate dielectric of the charge trap transistor are released using a partially-deep OFF state of the charge trap transistor while simultaneously enabling a self-heating operation.

19. The semiconductor memory of claim 18, wherein the self-heating circuit provides the self-heating effect due to n-p-n or p-n-p BJT current flowing from the drain to the source using a diffusion of the source as an emitter node, the substrate and a diffusion of the drain as a collector node of the charge trap transistor to de-trap the electrons that are trapped in the gate dielectric.

20. The semiconductor memory of claim 19, wherein:
in the programming operation, the self-heating circuit pulls the substrate to a voltage such that electrons are trapped within a gate dielectric of the charge trap transistor by using an ON state of the charge trap transistor;
the doped region is p-doped;
the channel region of the charge trap transistor is heated to a temperature in a range greater than 260° C. by the self-heating circuit; and
the gate dielectric layer is comprised of at least one selected from a group consisting of: $Al_2O_3$; $Ta_2O_3$; $TiO_2$; $La_2O_3$; $SrTiO_3$; $LaAlO_3$; $ZrO_2$; $Y_2O_3$; and $Gd_2O_3$.

* * * * *